(12) United States Patent
Takada

(10) Patent No.: US 9,196,841 B2
(45) Date of Patent: Nov. 24, 2015

(54) ARYLAMINE COMPOUND AND ELECTROLUMINESCENCE DEVICE USING THE SAME

(71) Applicant: SAMSUNG DISPLAY CO., LTD., Yongin, Gyeonggi-Do (KR)

(72) Inventor: Ichinori Takada, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/091,765

(22) Filed: Nov. 27, 2013

(65) Prior Publication Data

US 2014/0155592 A1    Jun. 5, 2014

(30) Foreign Application Priority Data

Nov. 30, 2012    (JP) .................. 2012-263821

(51) Int. Cl.
*H01L 51/50* (2006.01)
*H01L 51/00* (2006.01)

(52) U.S. Cl.
CPC ......... *H01L 51/0061* (2013.01); *H01L 51/5056* (2013.01)

(58) Field of Classification Search
None
See application file for complete search history.

(56) References Cited

U.S. PATENT DOCUMENTS

2014/0042412 A1*   2/2014   Ryu et al. .................. 257/40

FOREIGN PATENT DOCUMENTS

| EP | 2 421 064 A2 | 2/2012 |
|---|---|---|
| JP | 2010-248429 | 11/2010 |
| JP | 2011-178742 | 9/2011 |
| JP | 2011-178742 A | 9/2011 |
| JP | 2012-021156 | 2/2012 |
| KR | 10-1108519 B1 | 1/2012 |
| KR | 10-2012-0009984 A | 2/2012 |
| WO | WO 2012/029253 A1 | 3/2012 |

* cited by examiner

*Primary Examiner* — Gregory Clark
(74) *Attorney, Agent, or Firm* — Lee & Morse, P.C.

(57) ABSTRACT

An arylamine compound is represented by Formula 1

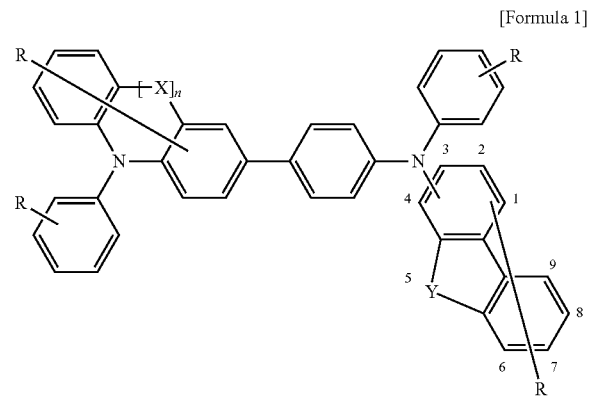

where R, X, Y, and n are further defined.

13 Claims, 1 Drawing Sheet

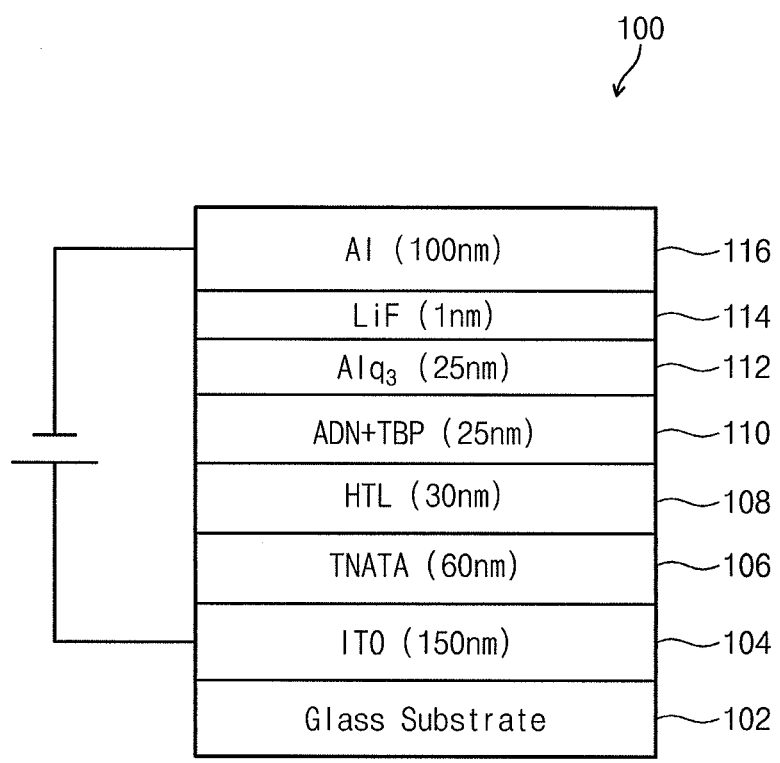

ND ELECTROLUMINESCENCE DEVICE USING THE SAME

ARYLAMINE COMPOUND AND ELECTROLUMINESCENCE DEVICE USING THE SAME

CROSS-REFERENCE TO RELATED APPLICATION

Japanese Patent Application No. 2012-263821, filed on Nov. 30, 2012, in the Korean Intellectual Property Office, and entitled: "ARYLAMINE COMPOUND AND ELECTROLUMINESCENCE DEVICE USING THE SAME," is incorporated by reference herein in its entirety.

BACKGROUND

1. Field

Embodiments relate to an arylamine compound and an organic electroluminescence device using the same 2. Description of the Related Art In recent years, organic electroluminescence (EL) displays, which are one type of image display, have been actively developed. Unlike a liquid crystal display or the like, the organic EL display is a self-luminescent display in which holes injected from an anode and electrons injected from a cathode are recombined in a light-emitting layer to thus emit a light from a light-emitting material including an organic compound of the light-emitting layer, thereby displaying an image.

An example of a light-emitting device (hereinafter referred to as an organic EL device) may include an organic EL device that includes an anode, a hole transport layer disposed on the anode, a light-emitting layer disposed on the hole transport layer, an electron transport layer disposed on the light-emitting layer, and a cathode disposed on the electron transport layer. Holes injected from the anode are injected into the light-emitting layer via the hole transport layer. Meanwhile, electrons are injected from the cathode, and then injected into the light-emitting layer via the electron transport layer. The holes and the electrons injected into the light-emitting layer are recombined to generate excitons within the light-emitting layer. The organic EL device emits a light by using a light generated by radiation and deactivation of the excitons.

SUMMARY

Embodiments are directed to An arylamine compound represented by Formula 1:

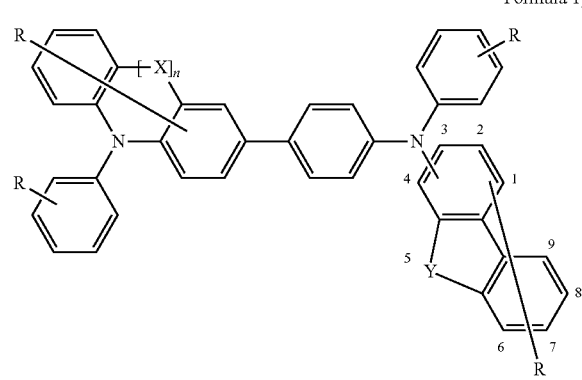

[Formula 1]

where X is a carbon atom, a nitrogen atom, or a sulfur atom, n is 1, Y is an oxygen atom or a sulfur atom, wherein, when Y is an oxygen atom, 1, 2, 3, 4, 5, 6, 7, 8, and 9 represent bonding positions on a dibenzofuranyl group formed thereby, and when Y is a sulfur atom, 1, 2, 3, 4, 5, 6, 7, 8, and 9 represent bonding positions on a dibenzothiophenyl group formed thereby, each R is independently a hydrogen atom, a deuterium atom, a fluorine atom, a chlorine atom, a cyano group, a trifluoromethyl group, a nitro group, a substitutable straight-chain or branched-chain alkyl group having 1 to 6 carbon atoms, a substitutable cycloalkyl group having 5 to 20 carbon atoms, a substitutable straight-chain or branched-chain alkenyl group having 2 to 6 carbon atoms, a substitutable straight-chain or branched-chain alkyloxy group having 1 to 6 carbon atoms, a substitutable cycloalkyloxy group having 5 to 20 carbon atoms, a substituent or non-substituent aromatic hydrocarbon group, a substituent or non-substituent aromatic hetero ring group, a substituent or non-substituent condensed multi-ring aromatic group, or a substituent or non-substituent aryloxy group, and in which monovalent, bivalent or adjacent two substituents may have a ring structure.

In Formula 1, a nitrogen atom of an arylamine group of the arylamine compound may be bonded to the dibenzofuranyl group or dibenzothiophenyl group at a position other than a para-position with respect to Y.

The nitrogen atom of the arylamine group may be bonded at the 3 position carbon of the dibenzofuranyl group or dibenzothiophenyl group.

X may be an oxygen atom or sulfur atom, and Y may be an oxygen atom.

Embodiments are also directed to an organic electroluminescence device including a hole transport layer including an arylamine compound represented by Formula 1:

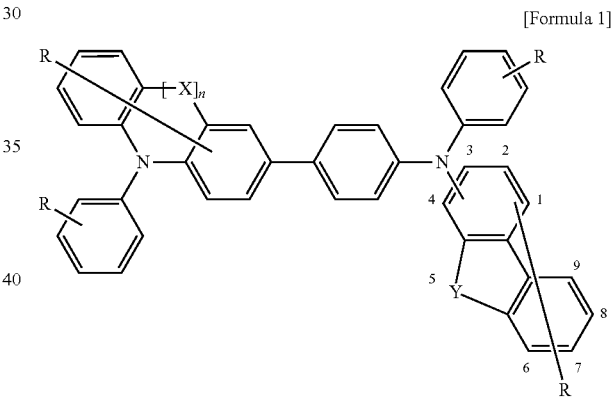

[Formula 1]

where X is a carbon atom, a nitrogen atom, or a sulfur atom, n is 1, Y is an oxygen atom or a sulfur atom, wherein, when Y is an oxygen atom, 1, 2, 3, 4, 5, 6, 7, 8, and 9 represent bonding positions on a dibenzofuranyl group formed thereby, and when Y is a sulfur atom, 1, 2, 3, 4, 5, 6, 7, 8, and 9 represent bonding positions on a dibenzothiophenyl group formed thereby, each R is independently a hydrogen atom, a deuterium atom, a fluorine atom, a chlorine atom, a cyano group, a trifluoromethyl group, a nitro group, a substitutable straight-chain or branched-chain alkyl group having 1 to 6 carbon atoms, a substitutable cycloalkyl group having 5 to 20 carbon atoms, a substitutable straight-chain or branched-chain alkenyl group having 2 to 6 carbon atoms, a substitutable straight-chain or branched-chain alkyloxy group having 1 to 6 carbon atoms, a substitutable cycloalkyloxy group having 5 to 20 carbon atoms, a substituent or non-substituent aromatic hydrocarbon group, a substituent or non-substituent aromatic hetero ring group, a substituent or non-substituent condensed multi-ring aromatic group, or a substituent or non-substituent aryloxy group, and monovalent, bivalent or adjacent two substituents may have a ring structure.

In Formula 1, a nitrogen atom of an arylamine group of the arylamine compound may be bonded to the dibenzofuranyl group or dibenzothiophenyl group at a position other than a para-position with respect to Y.

The nitrogen atom of the arylamine group may be bonded at 3 position carbon of the dibenzofuranyl group or dibenzothiophenyl group.

X may be an oxygen atom or sulfur atom, and Y may be an oxygen atom.

Embodiments are also directed to an organic electroluminescence device including at least one compound selected from the following Compounds 6 to 23:

(6)

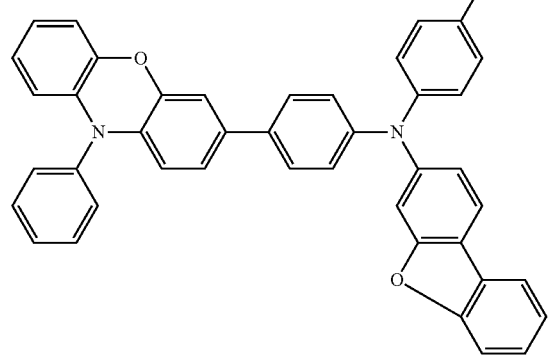

(7)

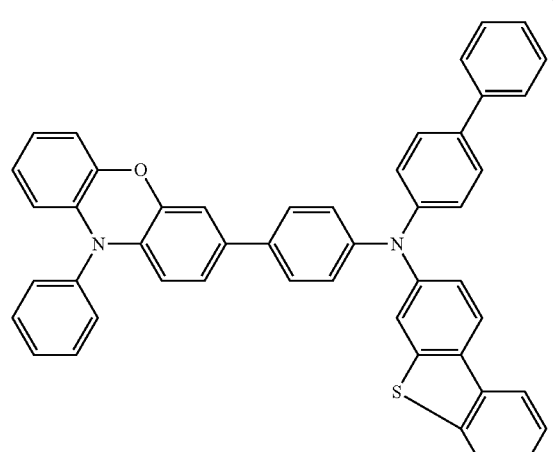

(8)

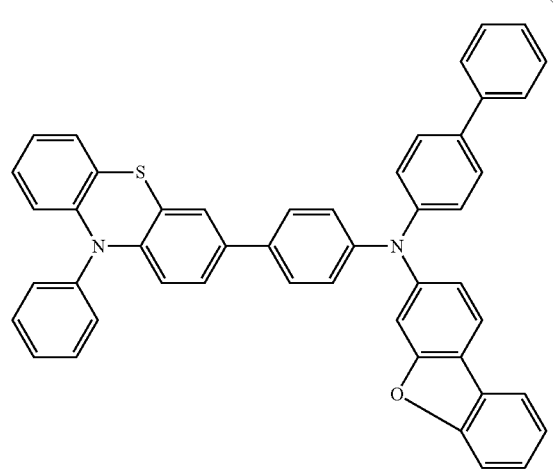

(9)

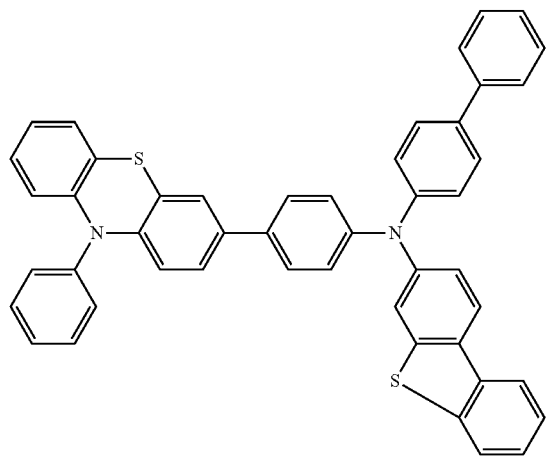

(10)

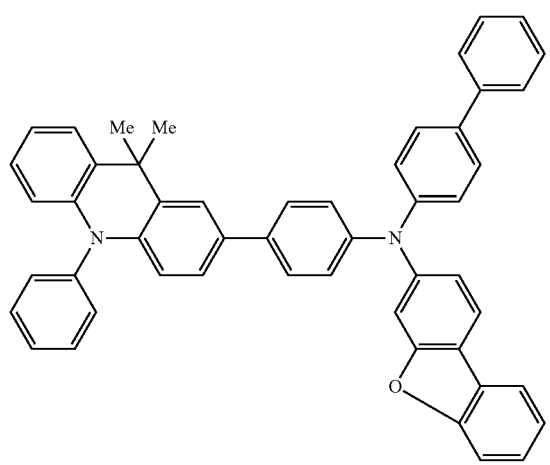

(11)

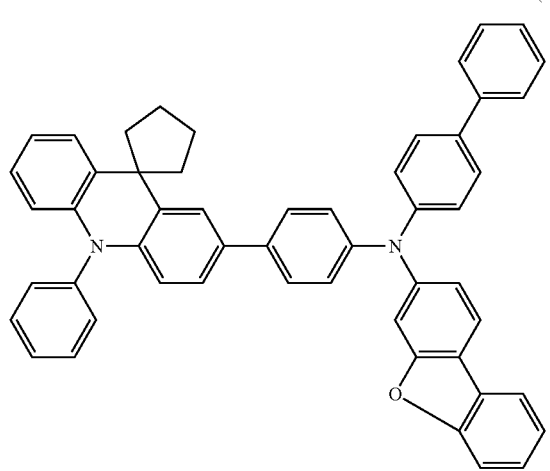

(12) 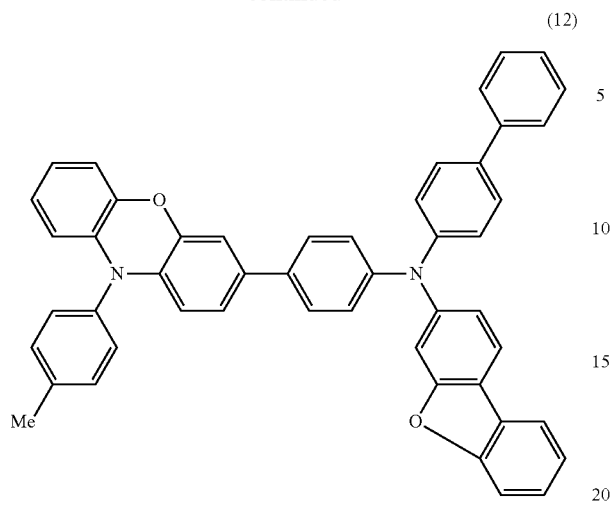
(15) 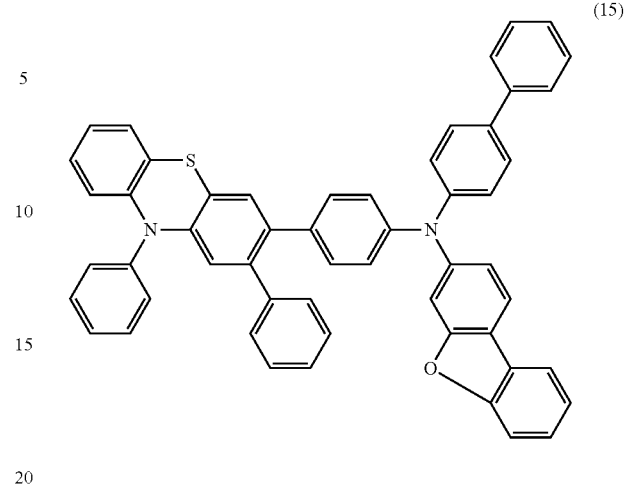
(13) 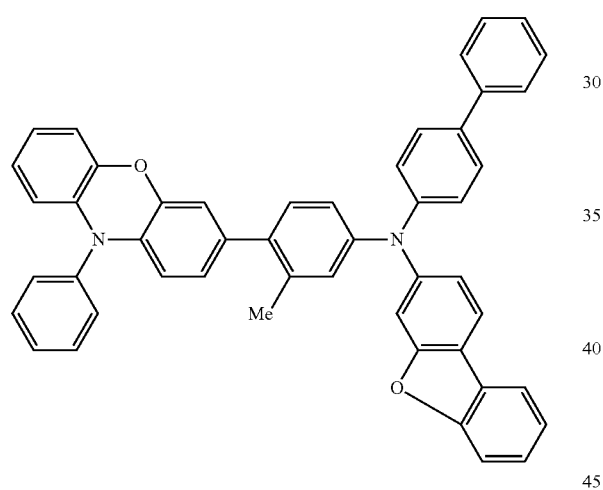
(16) 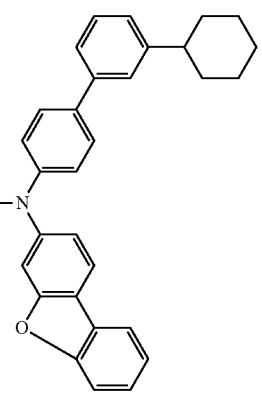
(14) 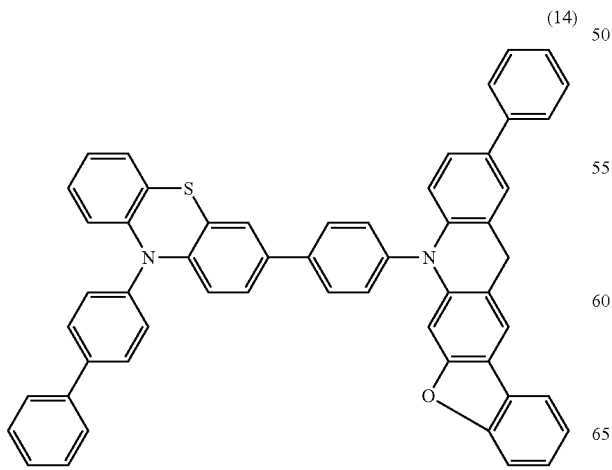
(17) 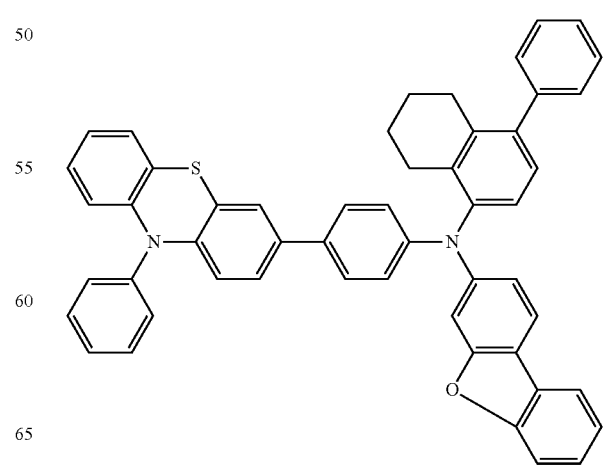

(18)

(19)

(20)

(21)

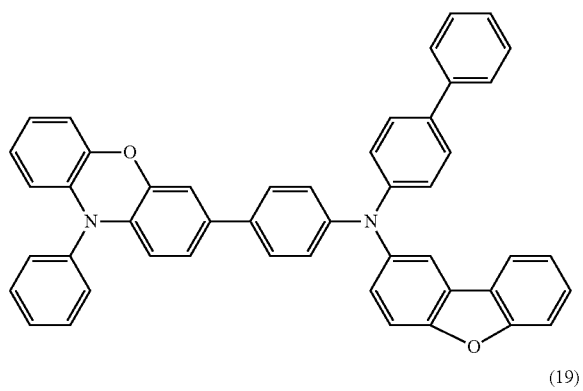

(22)

(23)

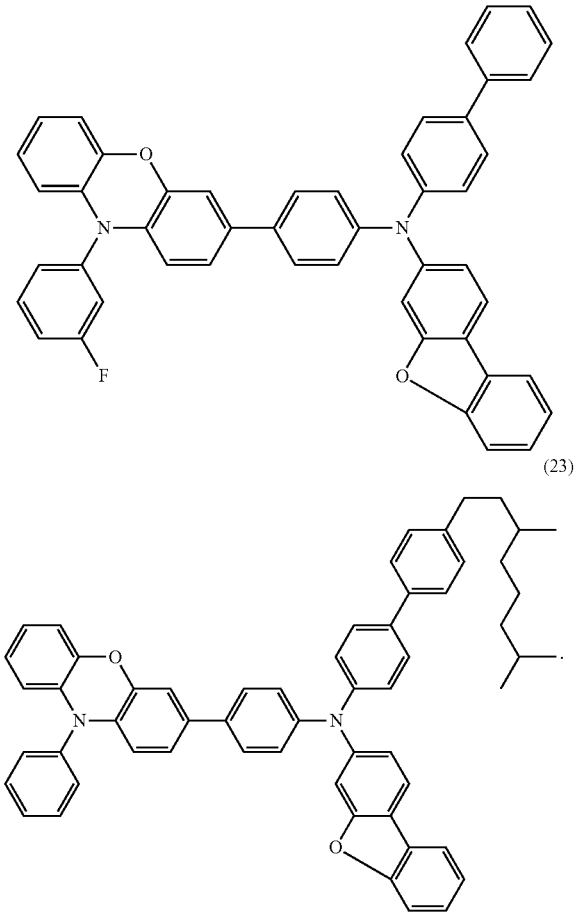

BRIEF DESCRIPTION OF THE DRAWING

Features will become apparent to those of ordinary skill in the art by describing in detail exemplary embodiments with reference to the attached drawing in which:

FIG. 1 illustrates a schematic cross-sectional view of an organic EL device 100 according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In order to solve the above-described limitations, the charge transport capability can be improved by introducing a dibenzopiperidine derivative substituent into an arylamine compound and the electron resistance can be improved by introducing a dibenzofuranyl group or dibenzothiophenyl group, and thus a high efficiency and long-life organic EL device can be realized.

An arylamine compound according to an embodiment is represented by Formula 1, as annotated. The arylamine compound includes part (A) in which a dibenzopiperidine derivative substituent is bonded to an amine with an aryl group in-between, part (B) in which a dibenzofuranyl group or dibenzothiophenyl group is bonded to the nitrogen atom of the amine, and part (C) in which an aryl group is bonded to nitrogen of the amine, thereby forming an arylamine.

be selected from a carbon atom, a nitrogen atom, an oxygen atom, or a sulfur atom. In an implementation, X may be an oxygen atom or a sulfur atom. When the arylamine compound has the above-described structure, the charge transport capability may be improved. Also, the resistance to electrons intruding into the hole transport layer may be improved. Therefore, a high efficiency and long-life organic EL device may be realized.

The arylamine compound includes the benzofuranyl group or the dibenzothiophenyl group. When the arylamine compound has the above-described structure, the electron resistance may be improved. In an implementation, the arylamine may have a benzofuranyl group.

As shown in Formula 2, in the arylamine compound according to an embodiment, the nitrogen atom of the arylamine group and Y of the dibenzofuranyl group or dibenzothiophenyl group may be positioned at the para-position. However, in other embodiments, the arylamine group and the

[Formula 1 (annotated)]

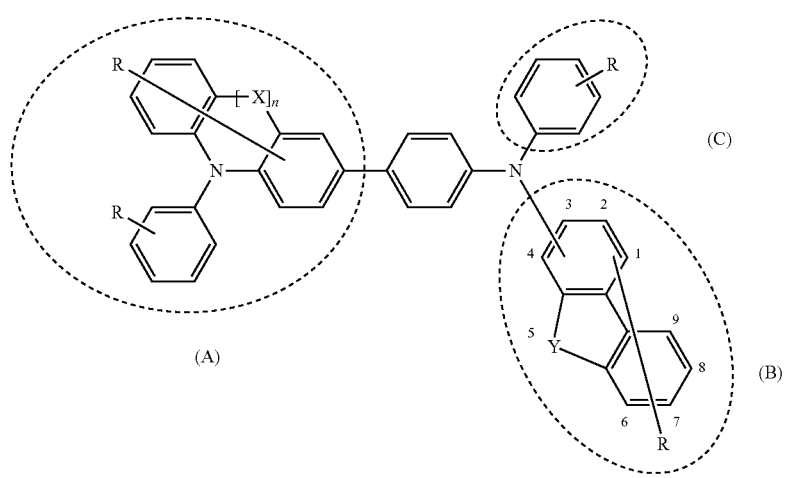

X may be a carbon atom, a nitrogen atom, or a sulfur atom, n may be 1, and Y may be an oxygen atom or a sulfur atom. When Y is an oxygen atom, 1, 2, 3, 4, 5, 6, 7, 8, and 9 represent bonding positions on a dibenzofuranyl group formed thereby, and when Y is a sulfur atom, 1, 2, 3, 4, 5, 6, 7, 8, and 9 represent bonding positions on a dibenzothiophenyl group formed thereby. Each R may independently be a hydrogen atom, a deuterium atom, a fluorine atom, a chlorine atom, a cyano group, a trifluoromethyl group, a nitro group, a substitutable straight-chain or branched-chain alkyl group having 1 to 6 carbon atoms, a substitutable cycloalkyl group having 5 to 20 carbon atoms, a substitutable straight-chain or branched-chain alkenyl group having 2 to 6 carbon atoms, a substitutable straight-chain or branched-chain alkyloxy group having 1 to 6 carbon atoms, a substitutable cycloalkyloxy group having 5 to 20 carbon atoms, a substituted or non-substituted aromatic hydrocarbon group, a substituted or non-substituted aromatic hetero ring group, a substituted or non-substituted condensed multi-ring aromatic group, or a substituted or non-substituted aryloxy group. Monovalent, bivalent or adjacent two substituents may have a ring structure.

In the dibenzopiperidine derivative substituent of the arylamine compound according to the inventive concept, X may dibenzofuranyl group or dibenzothiophenyl group may be bonded such that the nitrogen atom of the arylamine group and Y of the dibenzofuranyl or dibenzothiophenyl group are not in the para-position. Particularly, as shown in Formula 3, the nitrogen atom of the arylamine group may be bonded to the position of number of the dibenzofuranyl group or dibenzothiophenyl group. Since the arylamine compound has the above-described structure, the arylamine compound can improve the stability of the hole transport material.

[Formula 2]

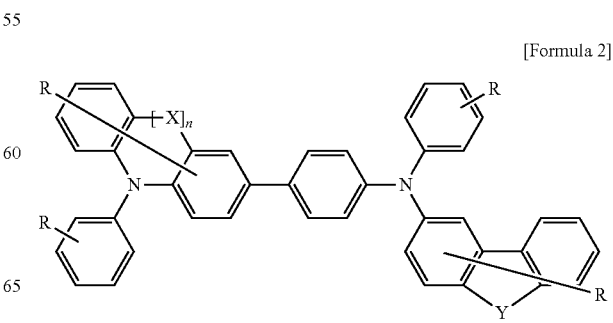

[Formula 3]

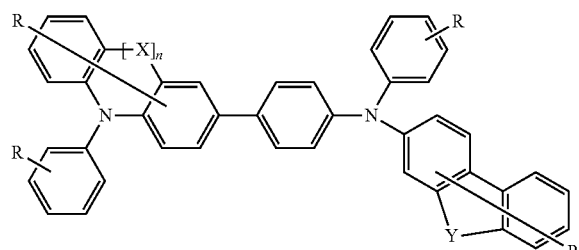

In Formulas 2 and 3, each R may be independently a hydrogen atom, a deuterium atom, a fluorine atom, a chlorine atom, a cyano group, a trifluoromethyl group, a nitro group, a substitutable straight-chain or branched-chain alkyl group having 1 to 6 carbon atoms, a substitutable cycloalkyl group having 5 to 20 carbon atoms, a substitutable straight-chain or branched-chain alkenyl group having 2 to 6 carbon atoms, a substitutable straight-chain or branched-chain alkyloxy group having 1 to 6 carbon atoms, a substitutable cycloalkyloxy group having 5 to 20 carbon atoms, a substituent or non-substituent aromatic hydrocarbon group, a substituted or non-substituted aromatic hetero ring group, a substituted or non-substituted condensed multi-ring aromatic group, or a substituted or non-substituted aryloxy group. Monovalent, bivalent or adjacent two substituents have a ring structure. When the arylamine compound includes such a substituent, the arylamine compound may have a structure in which part (A), part (B), and part (C) are asymmetric. Thus crystallization may be suppressed while a hole transport layer is formed. The arylamine compound may have a highly amorphous property. The life span of an organic EL device may be increased when the arylamine compound is used as a hole transport material.

An arylamine compound according to an embodiment may be a material represented by structural formulas of compounds 6 through 23, below.

(6)

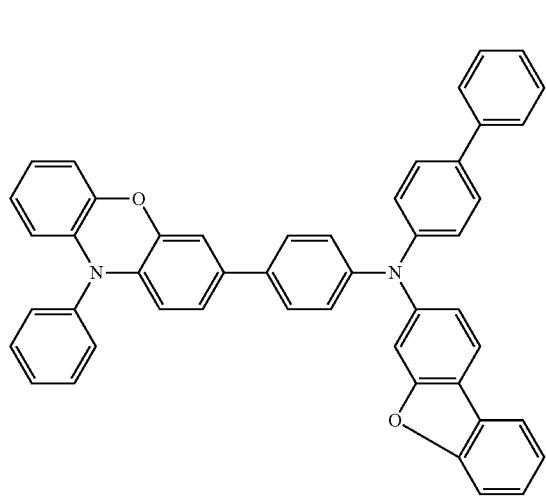

(7)

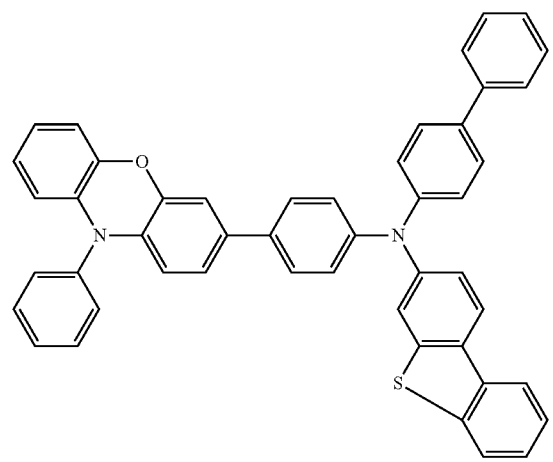

(8)

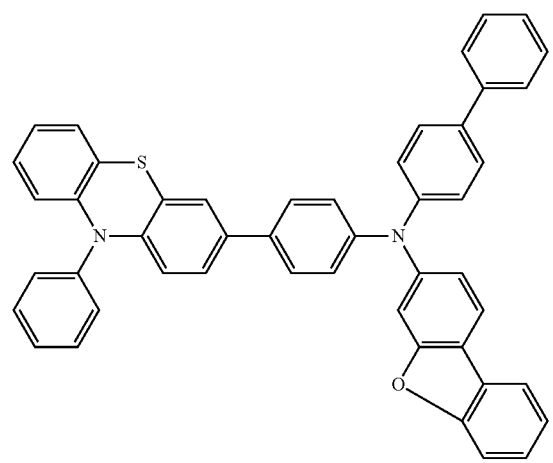

(9)

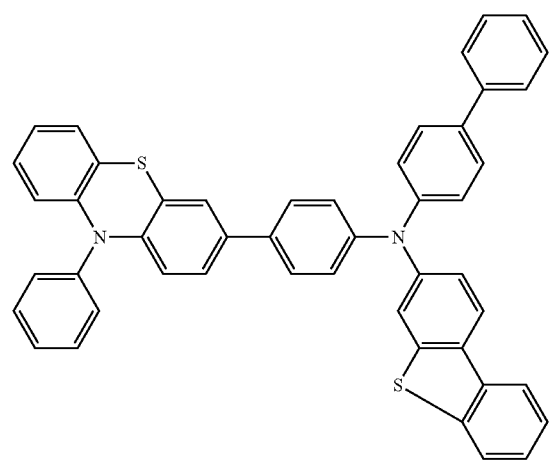

(10)
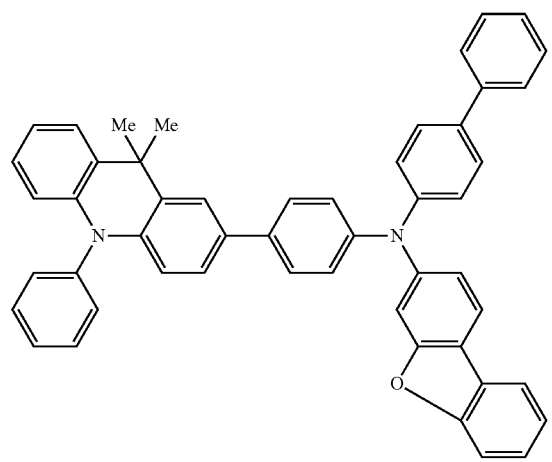
(11)
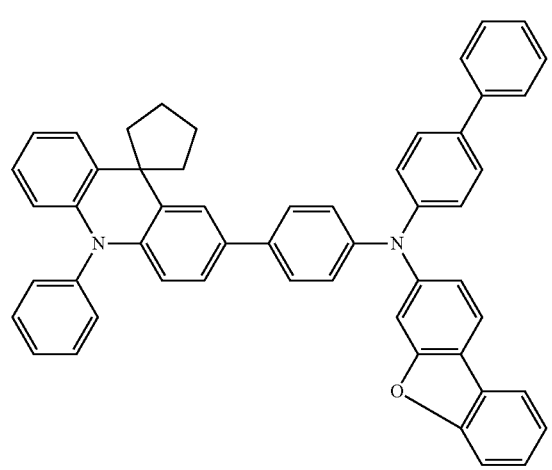
(12)
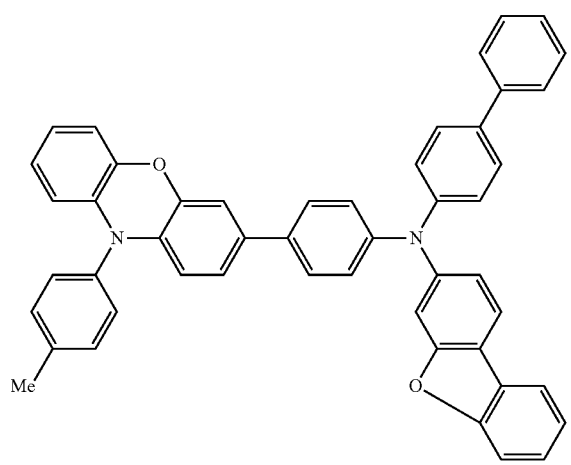
(13)
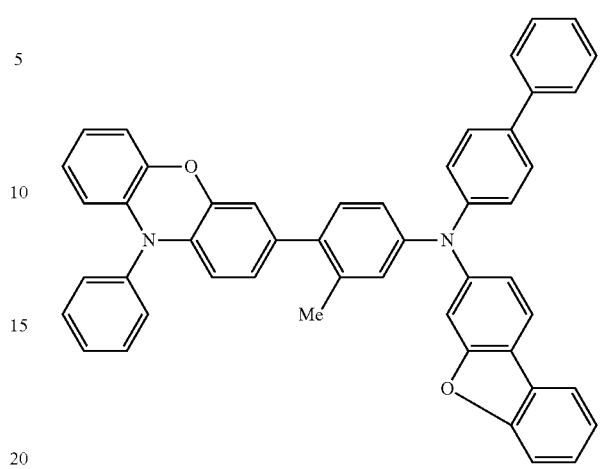
(14)
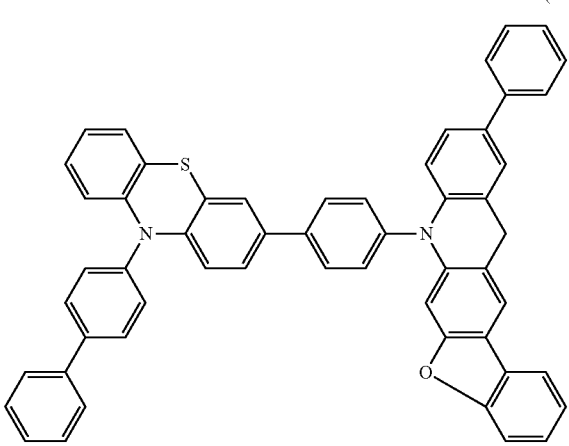
(15)
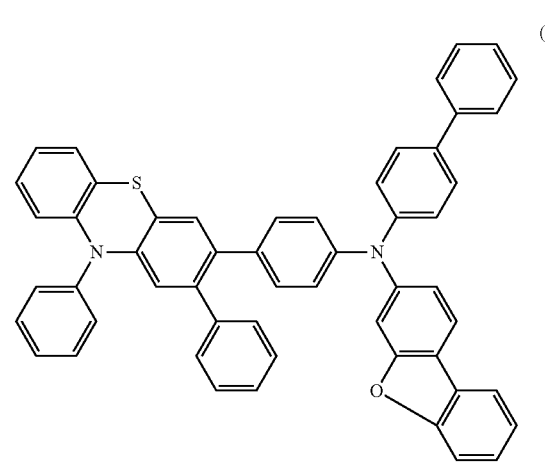

-continued
(16)
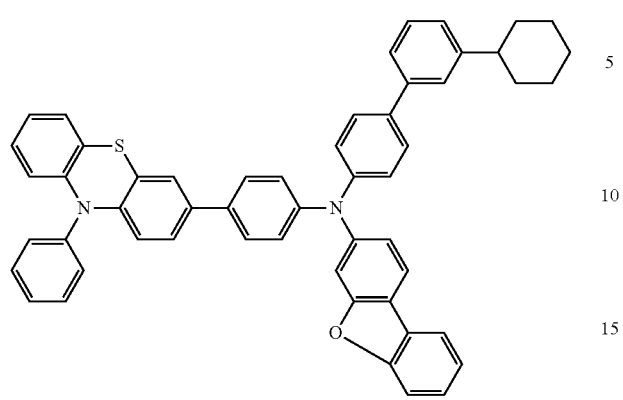
(17)
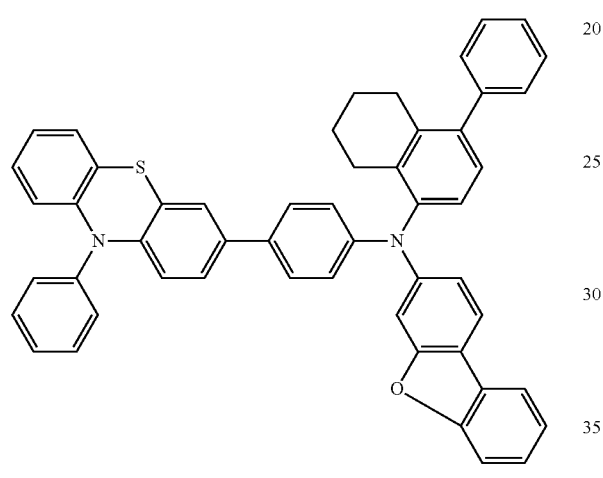
(18)
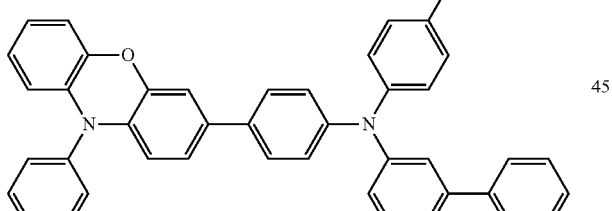
(19)
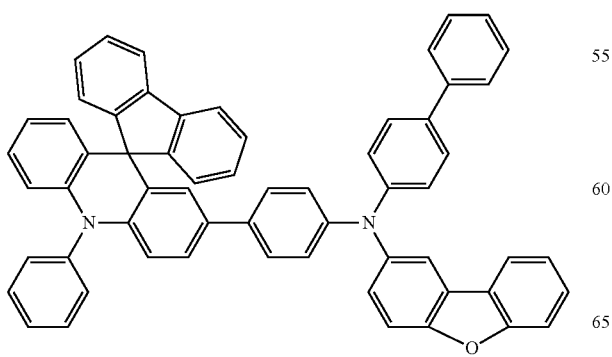
(20)
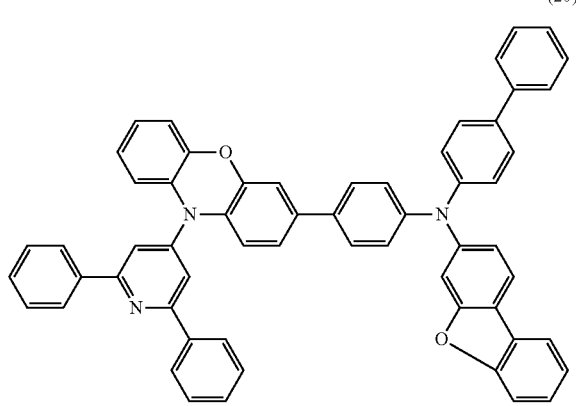
(21)
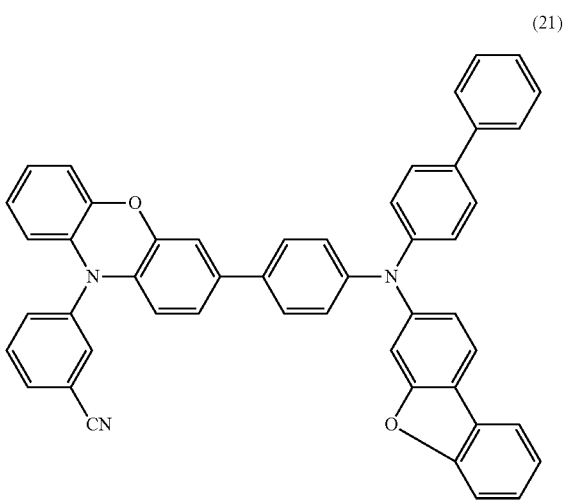
(22)
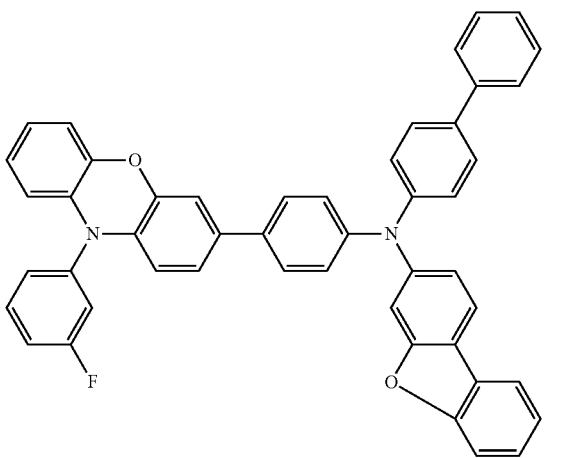

17
-continued (23)

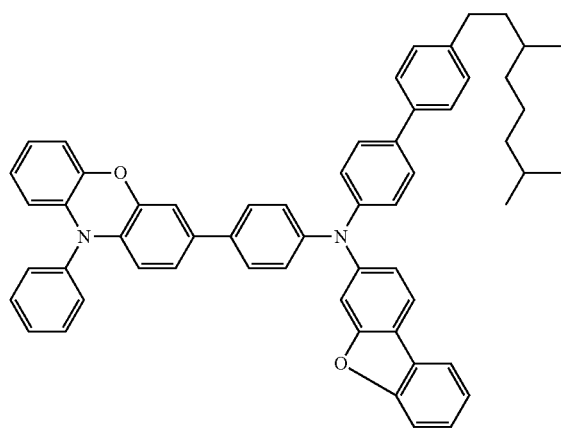

When the arylamine compound according to embodiments having one of the above-described chemical structures are used as hole transport layers for organic EL devices, such devices may exhibit high efficiency and a long life span. In the arylamine compounds according to embodiments, the charge transport capability may be improved by introducing a dibenzopiperidine derivative substituent into the arylamine compounds. Also, the resistance to electrons intruding into the hole transport layer from the light-emitting layer can be improved by introducing a dibenzofuranyl group or dibenzothiophenyl group. Also, in the arylamine compound according to an embodiment, as shown in part (A), part (B), and part (C) of the annotated Formula 1, substituents having different structures from one another are positioned at three bonding sites of a tertiary amine. Thus, the arylamine compound as a whole has an asymmetric structure, and crystallization while the hole transport layer is formed may be suppressed. The layer quality of the hole transport layer may be stable and the device operation life span may be increased. In operation, the device operation life span may be increased by secondary factors such as suppression of a slight change of carrier balance, suppression of material degradation due to local concentration of carriers, or the like.

Organic EL Device

An organic El device in which an arylamine compound according to an embodiment is used as a hole transport material will now be described. FIG. 1 is a schematic cross-sectional view of an organic EL device 100 according to an embodiment. The organic EL device 100 includes, for example, a substrate 102, an anode 104, a hole injection layer 106, a hole transport layer 108, a light-emitting layer 110, an electron transport layer 112, an electron injection layer 114, and a cathode 116.

The substrate 102 may be, for example, a transparent glass substrate, a semiconductor substrate formed of silicon or the like, or a flexible substrate formed of a flexible material such as a resin. The anode 104 may be disposed on the substrate 102, and may be formed of indium tin oxide (ITO), indium zinc oxide (IZO, or the like. The hole injection layer 106 may be disposed on the anode 104, and may include, for example, 4,4',4''-tris(N-1-naphthyl-N-phenylamino)triphenylamine (1-TNATA), 4,4-bis(N,N-di(3-tolyl)amino)-3,3-dimethylbiphenyl (HMTPD), and the like. The hole transport layer 108 may be disposed on the hole injection layer 106 and may be formed of a hole transport material for an organic EL device according to an embodiment. The light-emitting layer 110 may be disposed on the hole transport layer 108, and may be

18 formed by doping a host material including 9,10-di(2-naphthyl)anthracene (ADN) with tetra-t-butylperylene (TBP). The electron transport layer 112 may be disposed on the light-emitting layer 110, and may be formed of a material including, for example, tris(8-hydroxyquinolinato)aluminum (Alq3). The electron injection layer 114 may be disposed on the electron transport layer 112, and may be formed of a material including, for example, lithium fluoride (LiF). The cathode 116 may be disposed on the electron injection layer 114, and may be formed of a metal such as aluminum (Al), or a transparent material such as ITO, IZO, or the like. The thin layers may be formed by selecting a suitable layer forming method, such as a vacuum evaporation, a sputtering, deposition, or the like according to the specific material.

In the organic EL device 100 according to the present embodiment, a hole transport layer having high efficiency and a long life span may be formed by using the arylamine compound according to an embodiment as a hole transport material. The arylamine compounds according to embodiments may be applied to active matrix type organic EL devices employing TFTs.

The following Examples and Comparative Examples are provided in order to highlight characteristics of one or more embodiments, but it is to be understood that the Examples and Comparative Examples are not to be construed as limiting the scope of the embodiments, nor are the Comparative Examples to be construed as being outside the scope of the embodiments. Further, it is to be understood that the embodiments are not limited to the particular details described in the Examples and Comparative Examples.

EXAMPLES

Preparation

The above-described hole transport material for an organic EL device may be synthesized, for example, as follows.

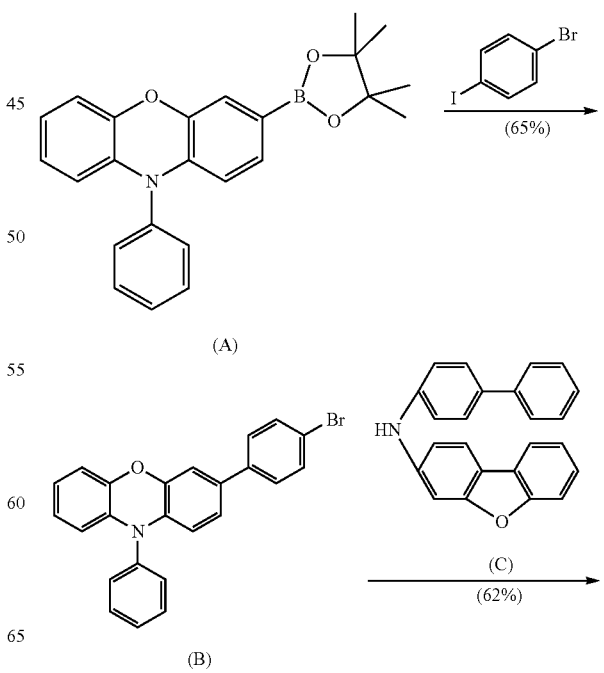

-continued

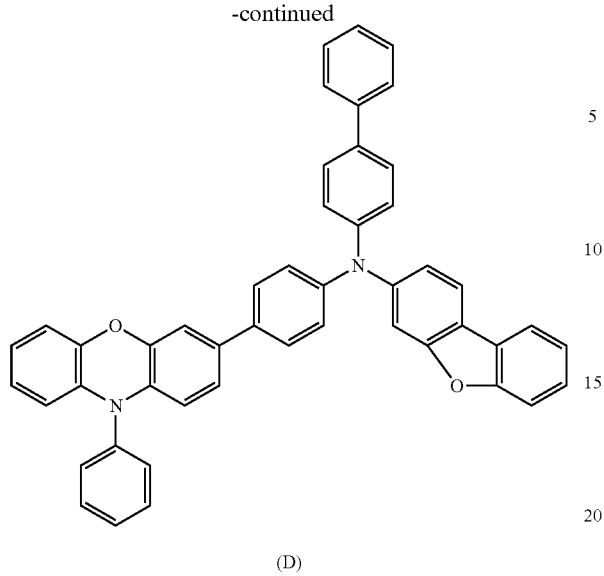

(D)

Synthesis of Compound B

A boronic acid pinacolato-substituted compound represented by Compound A (6.02 g, 15.6 mmol) and 4-bromo-1-iodobenzene (4.87 g, 17.2 mmol) were introduced into a mixture solution of toluene (200 mL), 2M-sodium carbonate aqueous solution (200 mL), and isopropanol (100 mL). Tetrakistriphenylphosphinepalladium(0) (903 mg, 0.782 mmol) was added to the mixture solution, and air was substituted with argon and removed while the mixture solution was stirred. The reaction solution provided thereby was heated and refluxed for 5 hours while being stirred, and cooled to room temperature. The reaction solution was extracted by toluene, was sequentially washed using water and a saturated saline solution, and was dried using anhydrous magnesium sulfate. The organic layer thus obtained was filtered and concentrated to obtain residue, and the residue was purified by silica gel chromatography (cyclohexane/toluene=1/0→1/1) to obtain the bromophenyl-substituted compound represented by compound B (4.21 g, 10.2 mmol).

Synthesis of Arylamine Compound D

The bromophenyl-substituted compound represented by Compound B (1.24 g, 2.99 mmol), the arylamine compound represented by compound C (1.10 g, 3.29 mmol), tris(dibenzylideneacetone)dipalladium(0), chloroform complex (93 mg, 0.090 mmol), and sodium-t-butoxide (862 mg, 8.97 mmol) were added to xylene (100 mL), air was substituted with argon and removed while the reaction mixture thus obtained was stirred. Tri-t-butylphosphine (1.5 M in Toluene, 0.120 mL, 0.179 mmol) was added to the reaction solution, and the reaction solution was heated and refluxed for 8 hours while being stirred, and was cooled to room temperature. The reaction solution was extracted using toluene to obtain an organic layer. The obtained organic layer was sequentially washed using water and a saturated saline solution, and was dried using anhydrous magnesium sulfate. The organic layer thus obtained was filtered and concentrated to obtain a residue. The residue was purified by silica gel chromatography (cyclohexane/toluene=10/1→1/1) and then recrystallized using toluene/ethanol to obtain the arylamine compound represented by Compound D (1.24 g, 1.85 mmol) (the same as Compound 6, above).

The identification of the synthesized compounds was performed by measuring mass spectra.

The above-described preparation method was used to obtain compounds of Examples 1 and 2. Also, for comparison, Comparative Examples 1 and 2 were prepared.

Example 1

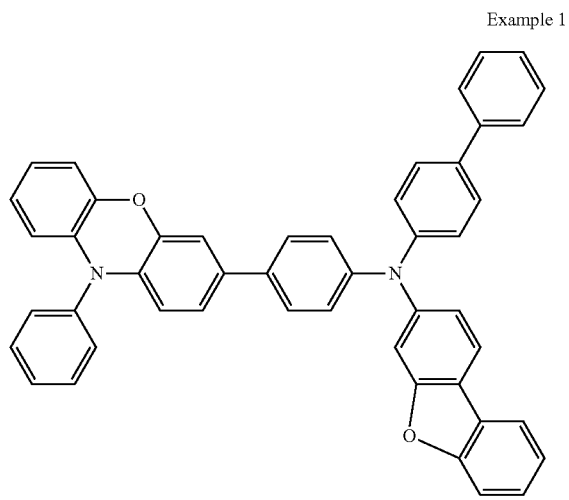

Example 2

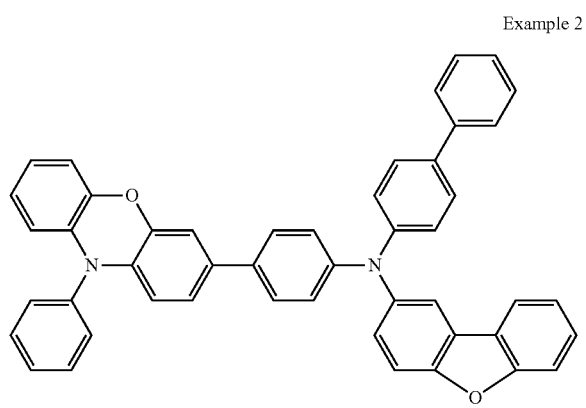

Comparative Example 1

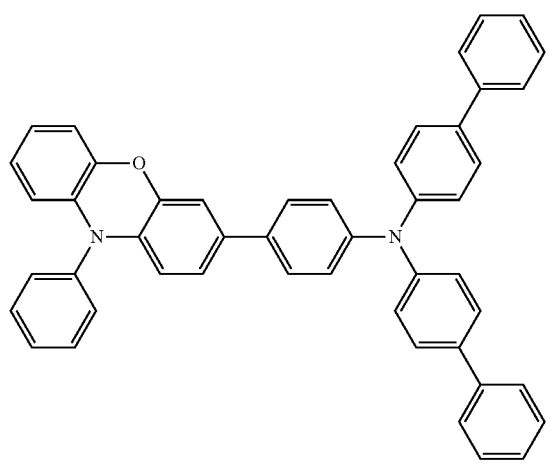

-continued

Comparative Example 2

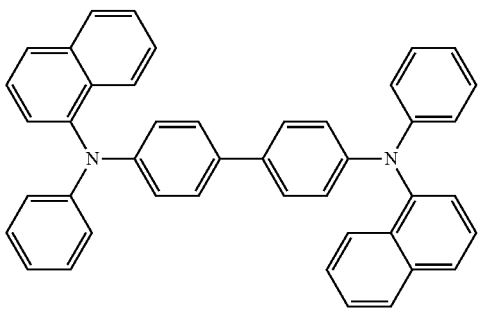

Organic EL devices were manufactured by using Examples 1 and 2 and Comparative Examples 1 and 2 as hole transport materials. For manufacturing the organic EL devices, a transparent glass substrate was used as a substrate 102, an anode 104 was formed of ITO to a thickness of 150 nm, a hole injection layer 106 was formed of HMTPD to a thickness of 60 nm, a hole transport layer 108 was formed to a thickness of 30 nm, a light-emitting layer 110 in which ADN was doped to 3% with TBP was formed to a thickness of 25 nm, an electron transport layer 112 was formed of Alq3 to a thickness of 25 nm, an electron injection layer 114 was formed of Li to a thickness of 1 nm, and a cathode 116 was formed of aluminum (Al) to a thickness of 100 nm.

The voltage, current efficiency and half life of the manufactured organic EL devices were evaluated. Here, the current efficiency represents a value at 10 mA/cm², and the half life represents an amount of time until the brightness decreases from an initial brightness of 1,000 cd/m² to half of the initial brightness. The evaluation results are shown in Table 1.

TABLE 1

|  | Voltage (V) | Current efficiency (Cd/A) | Life span (hr) (1,000 cd/m²) |
|---|---|---|---|
| Example 1 | 7.4 | 6.6 | 2,700 |
| Example 2 | 7.4 | 6.5 | 2,300 |
| Comparative Example 1 | 7.5 | 6.2 | 1,500 |
| Comparative Example 2 | 8.1 | 6.3 | 1,200 |

As may be seen in Table 1, compared to the compounds of Comparative Examples 1 and 2, when the compounds of Examples 1 and 2 were used, organic EL devices were operated at a lower voltage. Also, it may be seen that the compounds of Examples 1 and 2 exhibited higher current efficiencies than the compounds of Comparative Examples 1 and 2. These results may be due to an improvement in the charge transport capability of the compounds of Examples 1 and 2 obtained by introducing a dibenzopiperidine derivative substituent into an arylamine compound. Moreover, the resistance to electrons intruding into the hole transport layer may be improved by introducing a dibenzofuranyl group or dibenzothiophenyl group.

Also, regarding the half life, it may be seen that the compounds of Examples 1 and 2 have longer half lives than Comparative Examples 1 and 2. This result may be due to the compounds of Examples 1 and 2 having substituents having different structures at three bonding sites of tertiary amine. In particular, the compounds of Examples 1 and 2 have an asymmetric structure, and thus crystallization may be suppressed during the formation of the hole transport layer to thus improve the layer quality stability of the hole transport layer.

Also, when Examples 1 and 2 are compared, it may be seen that the compound of Example 1 exhibited a longer half-life than the compound of Example 2. This result may be due to the nitrogen atom of the arylamine group being bonded to the 3 position carbon of the dibenzofuranyl group, which may provide an increased half life. This result suggests that when, in the arylamine compounds according to embodiments, the nitrogen atom of the arylamine group and the oxygen atom of the dibenzofuranyl group are not in the para-position, the stability may be improved.

By way of summation and review, in the application of the organic EL device to a display apparatus, high efficiency and long life of the organic EL device are desirable. For providing the high efficiency and long life, the normalization, stabilization and durability of the hole transport layer are considered.

In order to promote high efficiency and long life span of an organic EL device, it is desirable to increase the resistance to electrons intruding into a new hole transport layer. Also, for long life span of the organic EL device, it is desirable to suppress the hole transport material from being crystallized while the hole transport layer is formed. A molecular skeleton including many hetero rings generally has high crystallinity. Accordingly, it is desirable to develop a novel hole transport material that includes hetero rings that that also allows crystallization to be suppressed.

Embodiments provide an arylamine compound as a hole transport material providing a high efficiency and long life span to an organic electroluminescence device An organic EL device according to embodiment may have a phenoxazinyl group or phenothiazinyl group, and the dibenzofuranyl group. Accordingly, the charge transport capability of the hole transport material may be improved, the organic EL device can realize low voltage operation and high efficiency.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. An arylamine compound represented by Formula 1:

[Formula 1]

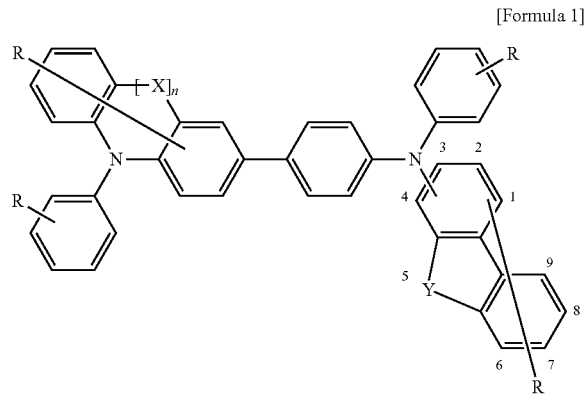

where X is a carbon atom, a nitrogen atom, an oxygen atom, or a sulfur atom, n is 1, Y is an oxygen atom or a sulfur atom, wherein, when Y is an oxygen atom, 1, 2, 3, 4, 5, 6, 7, 8, and 9 represent bonding positions on a dibenzofuranyl group formed thereby, and when Y is a sulfur atom, 1, 2, 3, 4, 5, 6, 7, 8, and 9 represent bonding positions on a dibenzothiophenyl group formed thereby, each R is independently a hydrogen atom, a deuterium atom, a fluorine atom, a chlorine atom, a cyano group, a trifluoromethyl group, a nitro group, a substitutable straight-chain or branched-chain alkyl group having 1 to 6 carbon atoms, a substitutable cycloalkyl group having 5 to 20 carbon atoms, a substitutable straight-chain or branched-chain alkenyl group having 2 to 6 carbon atoms, a substitutable straight-chain or branched-chain alkyloxy group having 1 to 6 carbon atoms, a substitutable cycloalkyloxy group having 5 to 20 carbon atoms, a substituent or non-substituent aromatic hydrocarbon group, a substituent or non-substituent aromatic hetero ring group, a substituent or non-substituent condensed multi-ring aromatic group, or a substituent or non-substituent aryloxy group, and in which monovalent, bivalent or adjacent two substituents may have a ring structure.

2. The arylamine compound as claimed in claim 1, wherein, in Formula 1, a nitrogen atom of an arylamine group of the arylamine compound is bonded to the dibenzofuranyl group or dibenzothiophenyl group at a position other than a para-position with respect to Y.

3. The arylamine compound as claimed in claim 1, wherein the nitrogen atom of the arylamine group is bonded at the 3 position carbon of the dibenzofuranyl group or dibenzothiophenyl group.

4. The arylamine compound as claimed in claim 1, wherein X is an oxygen atom or sulfur atom, and Y is an oxygen atom.

5. The arylamine compound as claimed in claim 2, wherein X is an oxygen atom or sulfur atom, and Y is an oxygen atom.

6. The arylamine compound as claimed in claim 3, wherein X is an oxygen atom or sulfur atom, and Y is an oxygen atom.

7. An organic electroluminescence device comprising a hole transport layer including an arylamine compound represented by Formula 1:

[Formula 1]

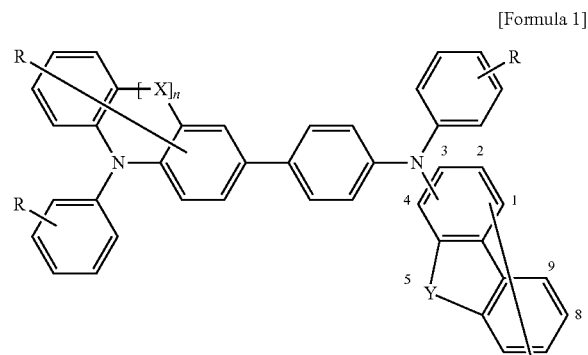

where X is a carbon atom, a nitrogen atom, an oxygen atom, or a sulfur atom, n is 1, Y is an oxygen atom or a sulfur atom, wherein, when Y is an oxygen atom, 1, 2, 3, 4, 5, 6, 7, 8, and 9 represent bonding positions on a dibenzofuranyl group formed thereby, and when Y is a sulfur atom, 1, 2, 3, 4, 5, 6, 7, 8, and 9 represent bonding positions on a dibenzothiophenyl group formed thereby, each R is independently a hydrogen atom, a deuterium atom, a fluorine atom, a chlorine atom, a cyano group, a trifluoromethyl group, a nitro group, a substitutable straight-chain or branched-chain alkyl group having 1 to 6 carbon atoms, a substitutable cycloalkyl group having 5 to 20 carbon atoms, a substitutable straight-chain or branched-chain alkenyl group having 2 to 6 carbon atoms, a substitutable straight-chain or branched-chain alkyloxy group having 1 to 6 carbon atoms, a substitutable cycloalkyloxy group having 5 to 20 carbon atoms, a substituent or non-substituent aromatic hydrocarbon group, a substituent or non-substituent aromatic hetero ring group, a substituent or non-substituent condensed multi-ring aromatic group, or a substituent or non-substituent aryloxy group, and monovalent, bivalent or adjacent two substituents may have a ring structure.

8. The organic electroluminescence device as claimed in claim 7, wherein, in Formula 1, a nitrogen atom of an arylamine group of the arylamine compound is bonded to the dibenzofuranyl group or dibenzothiophenyl group at a position other than a para-position with respect to Y.

9. The organic electroluminescence device as claimed in claim 8, wherein the nitrogen atom of the arylamine group is bonded at 3 position carbon of the dibenzofuranyl group or dibenzothiophenyl group.

10. The organic electroluminescence device as claimed in claim 7, wherein X is an oxygen atom or sulfur atom, and Y is an oxygen atom.

11. The organic electroluminescence device as claimed in claim 8, wherein X is an oxygen atom or sulfur atom, and Y is an oxygen atom.

12. The organic electroluminescence device as claimed in claim 9, wherein X is an oxygen atom or sulfur atom, and Y is an oxygen atom.

13. An organic electroluminescence device, comprising at least one compound selected from the following Compounds 6 to 23:

(6)

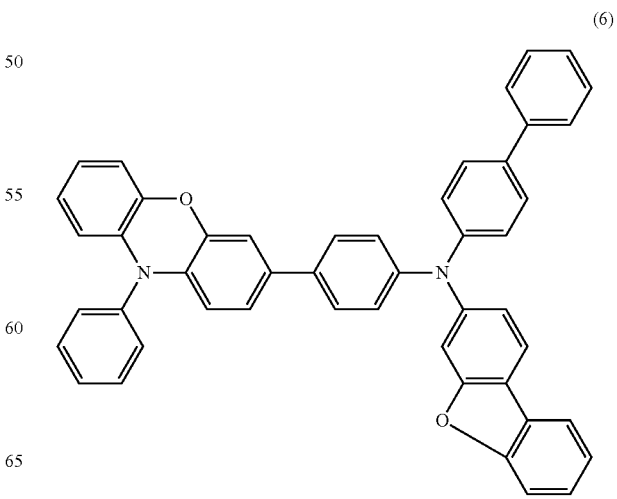

(7)
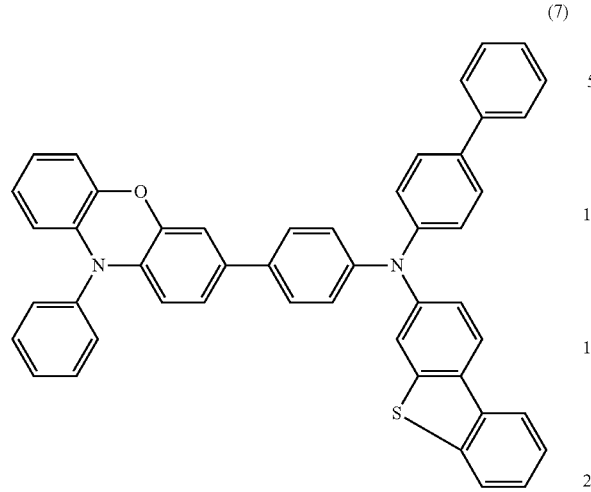
(10)
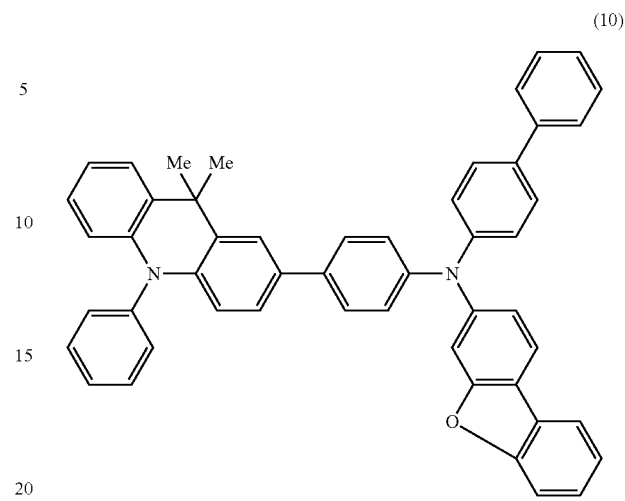
(8)
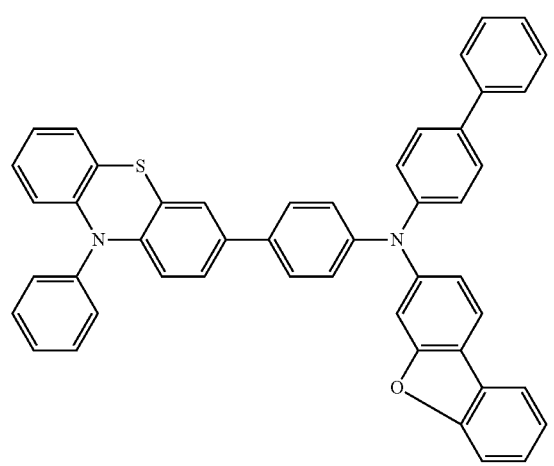
(11)
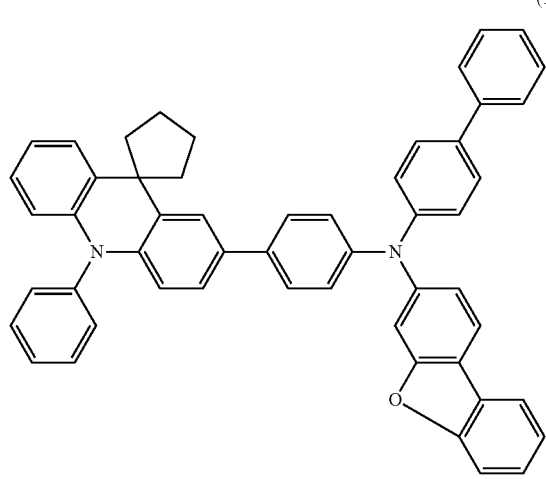
(9)
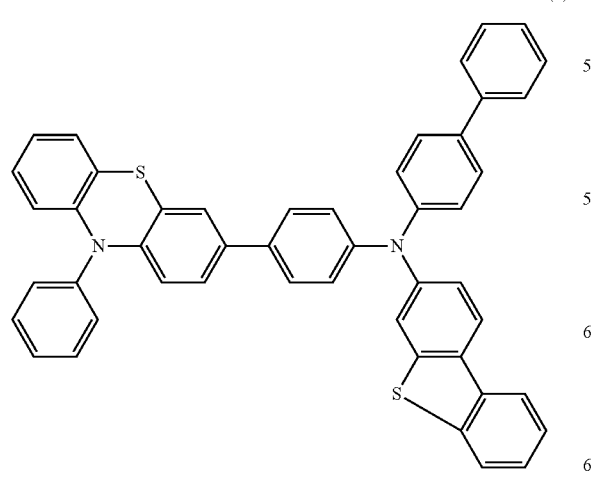
(12)
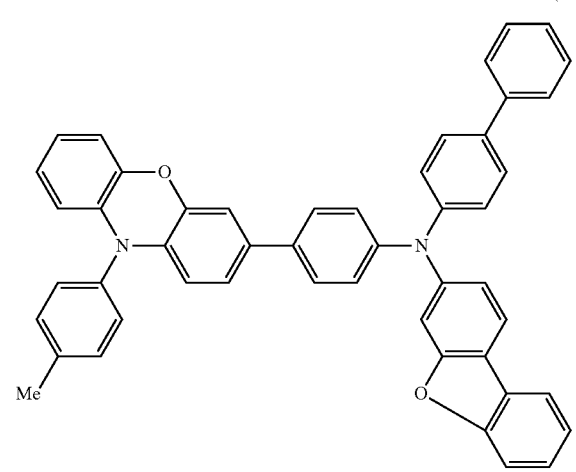

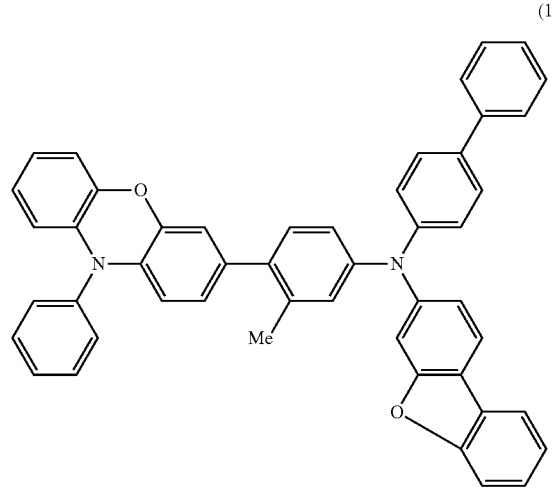
(13)
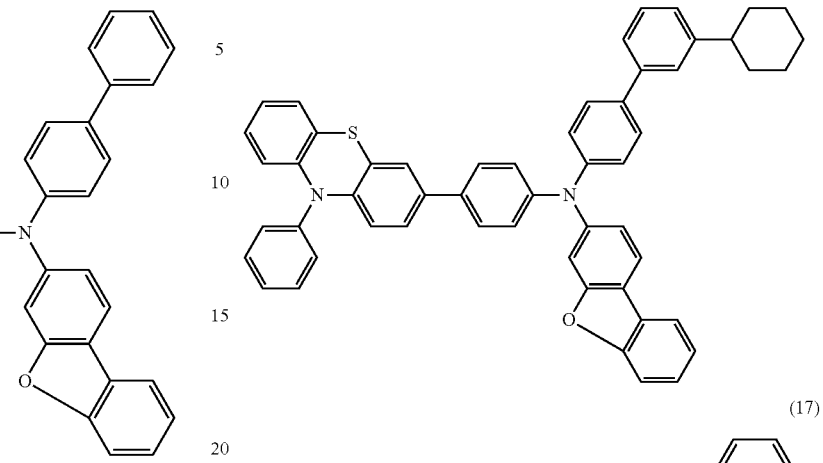
(16)
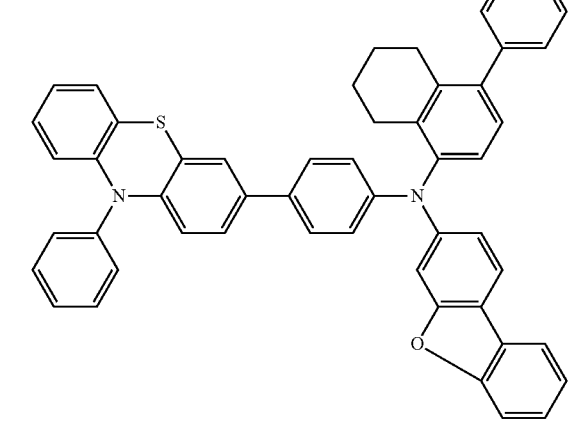
(14)
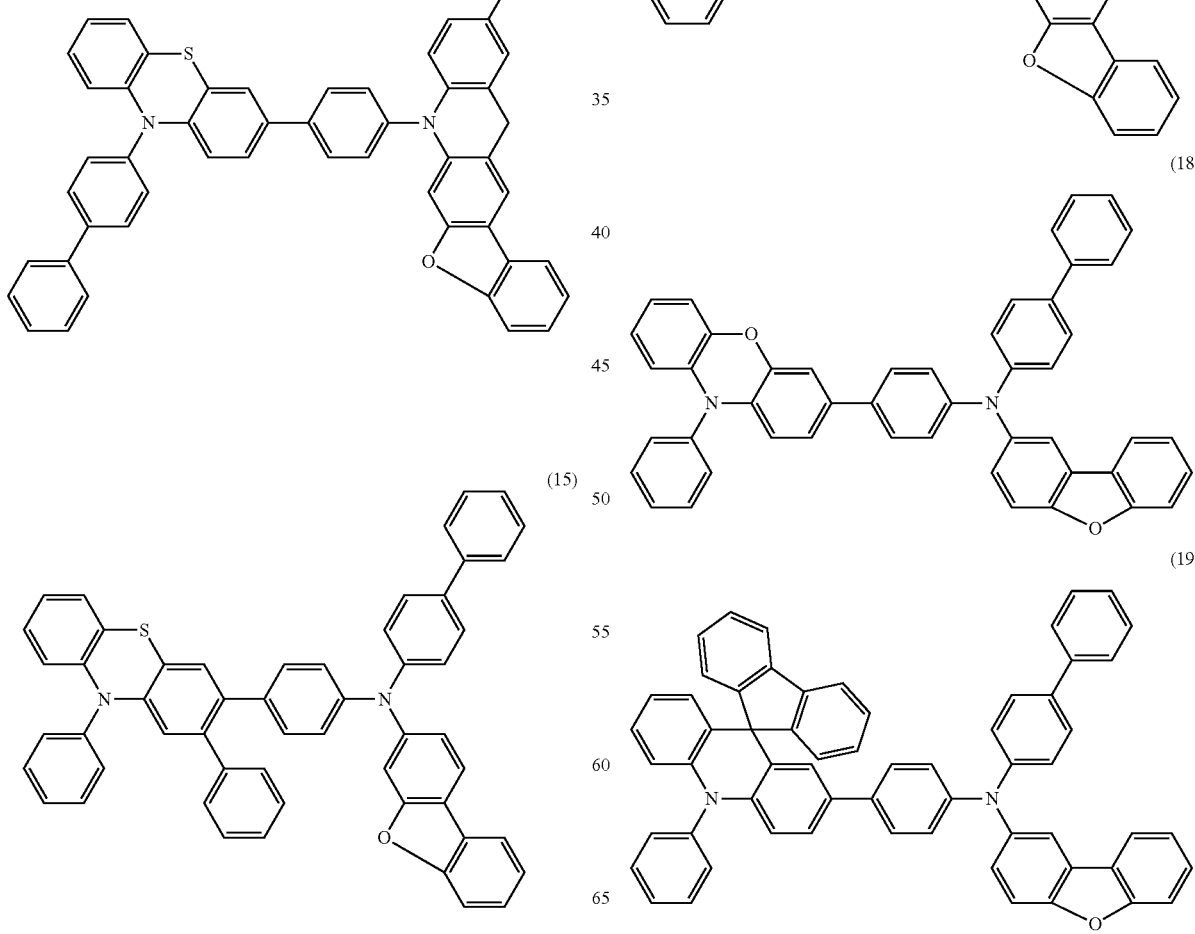
(15)
(17)
(18)
(19)

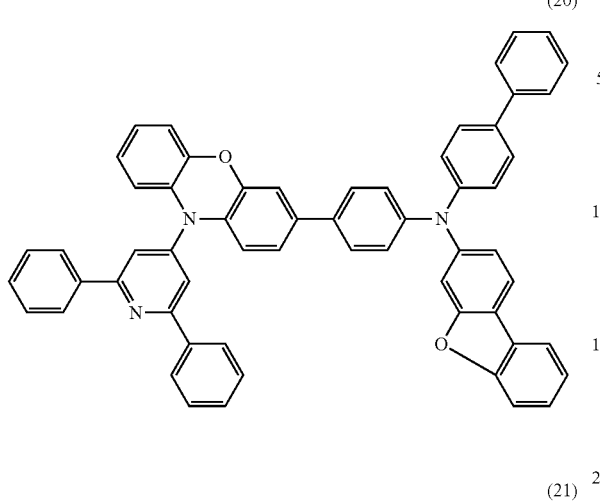
(20)
(21)
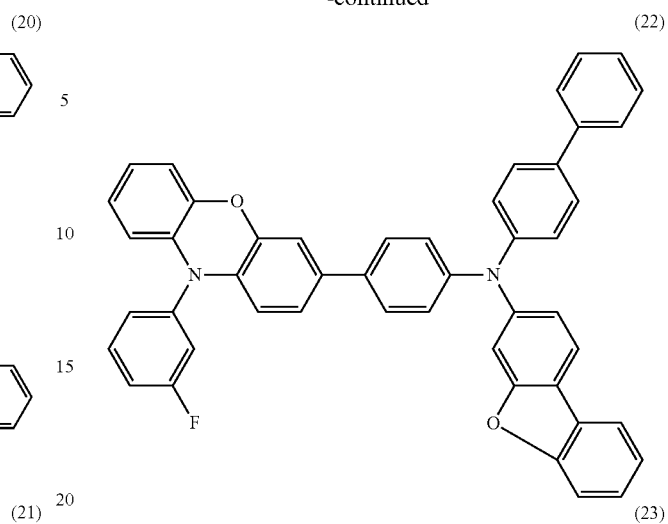
(22)
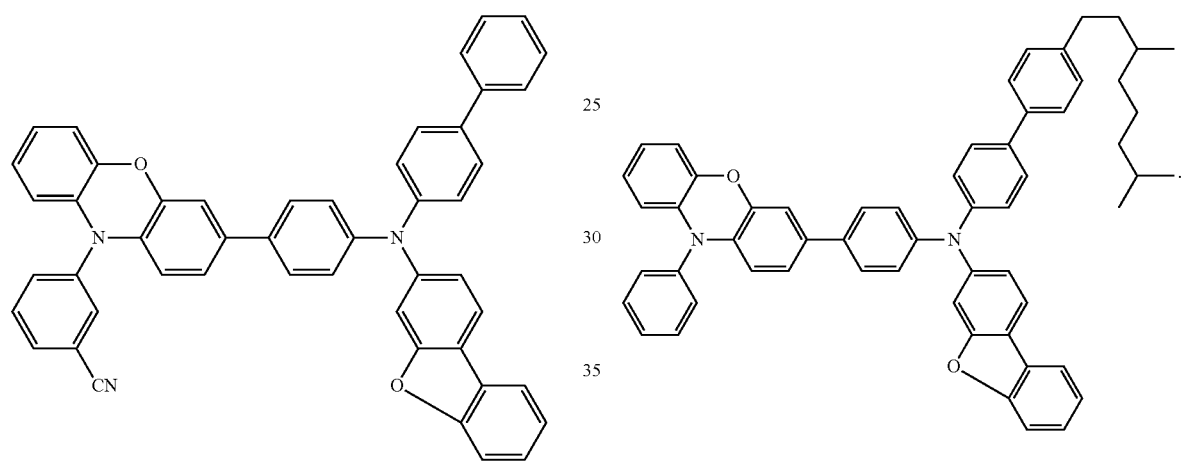
(23)
* * * * *